United States Patent [19]
Saitoh

[11] Patent Number: 5,502,669
[45] Date of Patent: Mar. 26, 1996

[54] ELECTRICALLY ERASABLE AND PROGRAMMABLE READ ONLY MEMORY DEVICE HAVING SELECTIVELY ERASABLE SECTORS

[75] Inventor: Kenji Saitoh, Tokyo, Japan

[73] Assignee: NEC Corporation, Tokyo, Japan

[21] Appl. No.: 353,235

[22] Filed: Dec. 2, 1994

[30] Foreign Application Priority Data

Dec. 2, 1993 [JP] Japan ................... 5-302577

[51] Int. Cl.$^6$ ............................ G11C 11/34; H01L 29/00
[52] U.S. Cl. ................... 365/185.27; 365/218; 257/506; 257/510; 257/513
[58] Field of Search ....................... 365/185, 218, 365/900, 189.09; 257/506, 510, 513

[56] References Cited

U.S. PATENT DOCUMENTS

| | | | |
|---|---|---|---|
| 5,051,795 | 9/1991 | Gill et al. | 257/315 |
| 5,065,212 | 11/1991 | Ohata et al. | 257/500 |
| 5,262,985 | 11/1993 | Wada | 365/218 |
| 5,280,454 | 1/1994 | Tanaka et al. | 365/218 |
| 5,384,743 | 1/1995 | Rouy | 365/218 |

FOREIGN PATENT DOCUMENTS 403021039  1/1991  Japan ................... 257/513

Primary Examiner—David C. Nelms
Assistant Examiner—Son Dinh
Attorney, Agent, or Firm—Popham, Haik, Schnobrich & Kaufman, Ltd.

[57] ABSTRACT

An electrically erasable and programmable memory device has a twin well electrically separated by an insulating wall into a plurality of sections respectively assigned to a plurality of memory sectors. The plurality of sections are selectively biased for erasing data bits stored in floating type field effect transistors that form the plurality of memory sectors.

5 Claims, 6 Drawing Sheets

ELECTRICALLY ERASABLE AND PROGRAMMABLE READ ONLY MEMORY DEVICE HAVING SELECTIVELY ERASABLE SECTORS

FIELD OF THE INVENTION

This invention relates to an electrically erasable and programmable read only memory device and, more particularly, to an electrically erasable and programmable read only memory device having memory sectors selectively erased.

DESCRIPTION OF THE RELATED ART

A typical example of the electrically erasable and programmable read only memory device is illustrated in FIGS. 1 and 2 of the drawings showing the prior art electrically erasable and programmable read only memory device fabricated on a p-type silicon substrate 1. N-type wells 2a and 2b are formed in the p-type silicon substrate 1 at intervals, and p-type wells 3a and 3b are nested in the n-type wells 2a and 2b. The n-type well 2a/2b and the p-type well 3a/3b form a twin well.

A field oxide layer 4 of 8000 angstroms thick is selectively grown on the major surface of the silicon substrate 1, and gate oxide films 5a and 5b of 100 angstroms thick cover the exposed areas of the p-type silicon substrate 1 and the exposed areas of the p-type wells 3a/3b. On the gate oxide films 5a are formed gate electrodes 6a, 6b and 6c which form n-channel enhancement type field effect transistors Q1, Q2 and Q3 together with n-type source/drain regions 7a, 7b and 7c. On the other hand, floating gate electrodes 8a, 8b, 8c and 8d are formed on the gate oxide films 5b, and are electrically isolated by second gate oxide films 9a and 9b. In this instance, the second gate oxide films 9a and 9b are 200 angstroms in thickness.

Control gate electrodes 10a and 10b extend on the second gate oxide films 9a and 9b, and each control gate electrode 10a/10b forms floating gate type field effect transistors FG1 or FG2 together with the gate oxide film 5a, the floating gate electrode 9a/9b, the second gate oxide film 9a/9b and source/drain regions 10aa, 10b, 10c, 10d or 10e.

The n-channel enhancement type field effect transistors Q1, Q2 and Q3 and the floating gate type field effect transistors FG1 and FG2 are covered with an inter-level insulating layer 11, and bit lines 12a, 12b, 12c and 12d extend on the inter-level insulating layer 11. The bit lines 12a to 12d pass through contact holes formed in the inter-level insulating layer 11, and are held in contact with the n-type drain regions 10b to 10d.

Each of the floating gate type field effect transistors FG1 and FG2 changes the threshold depending upon the amount of electric charge accumulated in the floating gate electrode 8a, 8b, 8c or 8d. If a large amount of electrons are accumulated in the floating gate electrode 8a/8b/8c/8d, the floating gate type field effect transistor FG1 or FG2 increases the threshold, and the control gate electrode 10a or 10b hardly produces a conductive channel between the n-type source and drain regions with a standard read-out voltage level. On the other hand, when the electrons are evacuated from the floating gate electrode 8a/8b/8c/8d, the threshold is lowered, and the read-out voltage produces the conductive channel between the n-type source and drain regions. Thus, the high and low thresholds corresponding to the two logic levels, and data bits are stored in the floating gate type field effect transistors FG1 and FG2 in the form of accumulated electrons.

The prior art electrically erasable and programmable read only memory device behaves as follows. When a data bit is written into a floating gate type field effect transistor FG1 or FG2, the n-type source region 10aa/10b/10c/10d and the substrate 1 are grounded, and the n-type drain region 10b/10c10d/10e and the control gate electrode 10a/10b are changed to a positive high voltage level. Then, hot electrons are produced at the p-n junction between the n-type drain region 10b/10c/10d/10e and the p-type well 3a/3b, and are attracted toward the floating gate electrode 8a/8b/8c/8d due to electric field extending from the control gate electrode 10a/10b. The hot electrons are accumulated in the floating gate electrode 8a/8b/8c/8d, and the floating gate type field effect transistor FG1 or FG2 changes the threshold to the high level.

On the other hand, when erasing the data bit, the n-type well 2a/2b and the p-type well 3a/3b are biased with 5 volts, and the control gate electrode 10a or 10b is biased to −14 volts. The n-type source and drain regions are opened. Then, the Fowler-Nordheim tunneling phenomenon takes place, and the accumulated electrons are evacuated from the floating gate electrode 8a/8b/8c/8d.

In the prior art electrically erasable and programmable read only memory device, the n-channel enhancement type field effect transistor Q2 is interposed between the control gate electrodes 8a and 8b, and forms a part of sub-decoders 13a to 13c. The sub-decoders 13a to 13c divide an array of floating gate type field effect transistors FG1 and FG2 into erasable sectors 14a, 14b, 14c and 14d as shown in FIG. 3, and the n-channel enhancement type field effect transistors Q2 selectively turn off for cutting off the propagation path of the negative voltage level in the erasing operation. For this reason, the erasable sector 14a/14b/14c/14d is the unit of the concurrently erased floating gate type field effect transistors FG1/FG2.

Each erasable sector 14a/14b/14c/14d extends in parallel to the bit lines 12a to 12d. If an erasable sector extends in parallel to the word line or a control gate electrode, the bias voltage at 5 volts is applied to a twin well for floating gate type field effect transistors not to be erased, and data bits are mistakenly erased.

A problem is encountered in the prior art electrically erasable and programmable read only memory device in that the sub-decoders 13a to 13c occupy a substantial amount of real estate. If the electrically erasable and programmable read only memory device is increased in memory capacity, the problem becomes serious, because each control gate electrode 8a/8b should be split into shorter sections for uniformly erasing the floating gate type field effect transistors FG1/FG2. In other words, an electrically erasable and programmable read only memory device with a larger memory capacity requires a large number of sub-decoders, and these sub-decoders not only occupy wide area but also make the design work complex.

SUMMARY OF THE INVENTION

It is therefore an important object of the present invention to provide an electrically erasable and programmable read only memory device memory sectors of which is selectively erased without sub-decoders inserted in a word line.

To accomplish the object, the present invention proposes to selectively change the potential level of sections of a well where memory cells are fabricated.

In accordance with the present invention, there is provided an electrically erasable and programmable read only memory device fabricated on a semiconductor region, comprising: a memory cell array implemented by a plurality of electrically erasable and programmable memory cells formed in the semiconductor region for storing data bits; an isolating wall means formed in the semiconductor region for electrically dividing the semiconductor region into a plurality of sections, and causing the plurality of electrically erasable and programmable memory cells to form a plurality of memory sectors respectively formed in the sections; a write-in and read-out means for selectively writing data bits into and reading out the data bits from the plurality of electrically erasable and programmable read only memory cells; and an erasing means having a biasing circuit selectively biasing the plurality of sections for concurrently erasing the data bits stored in the electrically erasable and programmable read only memory cells of each memory sector.

BRIEF DESCRIPTION OF THE DRAWINGS

The features and advantages of the electrically erasable and programmable read only memory device according to the present invention will be more clearly understood from the following description taken in conjunction with the accompanying drawings in which.

DESCRIPTION OF THE PREFERRED EMBODIMENTS

First Embodiment

Figure 1:
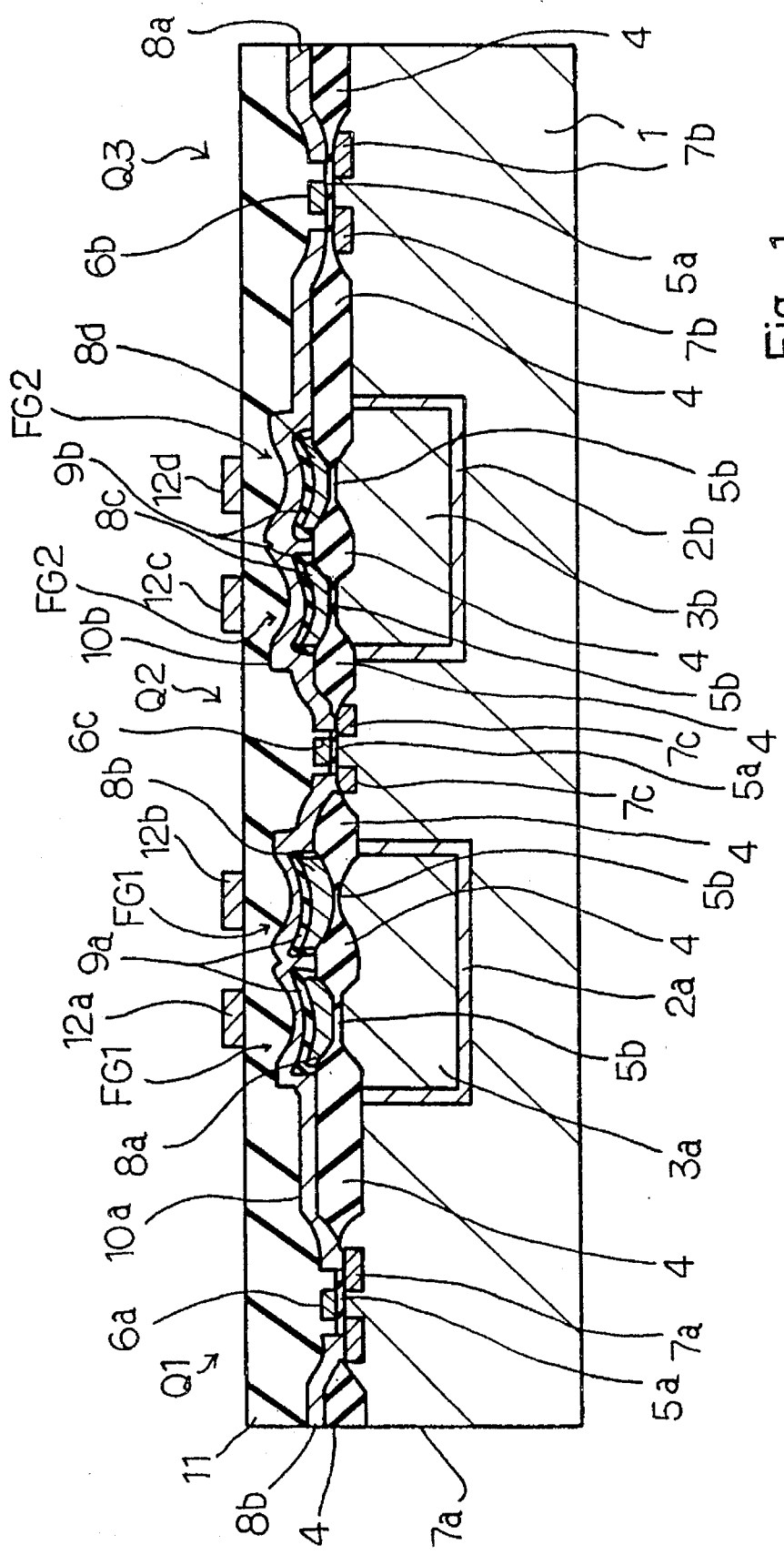
FIG. 1 is a cross sectional view showing the structure of the prior art electrically erasable and programmable read only memory device on a cross section parallel to the word line.
Figure 2:
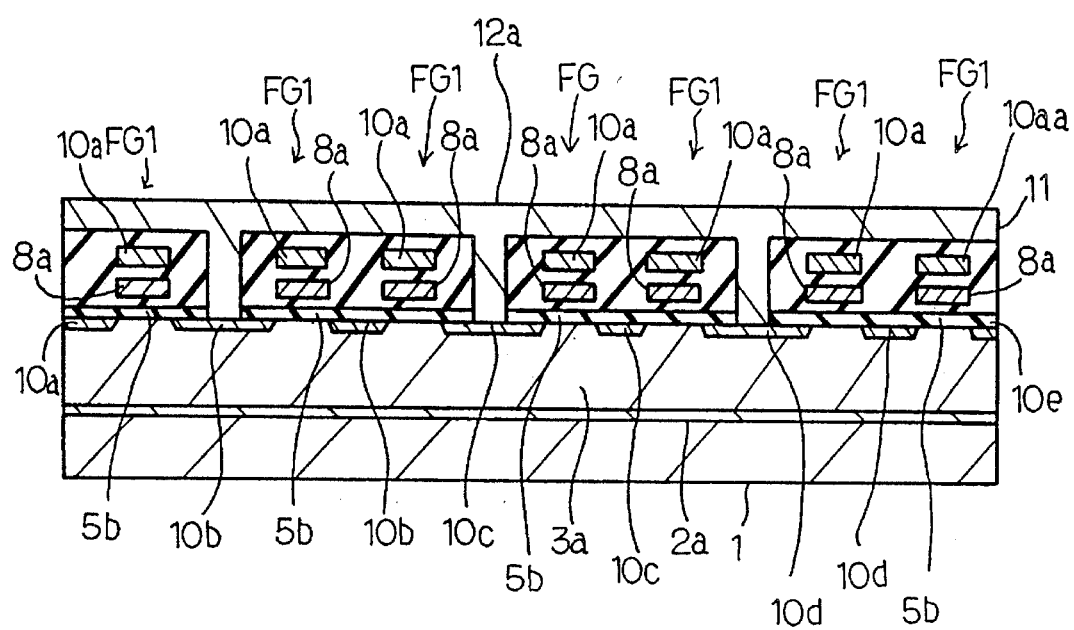
FIG. 2 is a cross sectional view taken along line A—A and showing the structure of the prior art electrically erasable and programmable read only memory device on a cross section parallel to the bit line.
Figure 3:
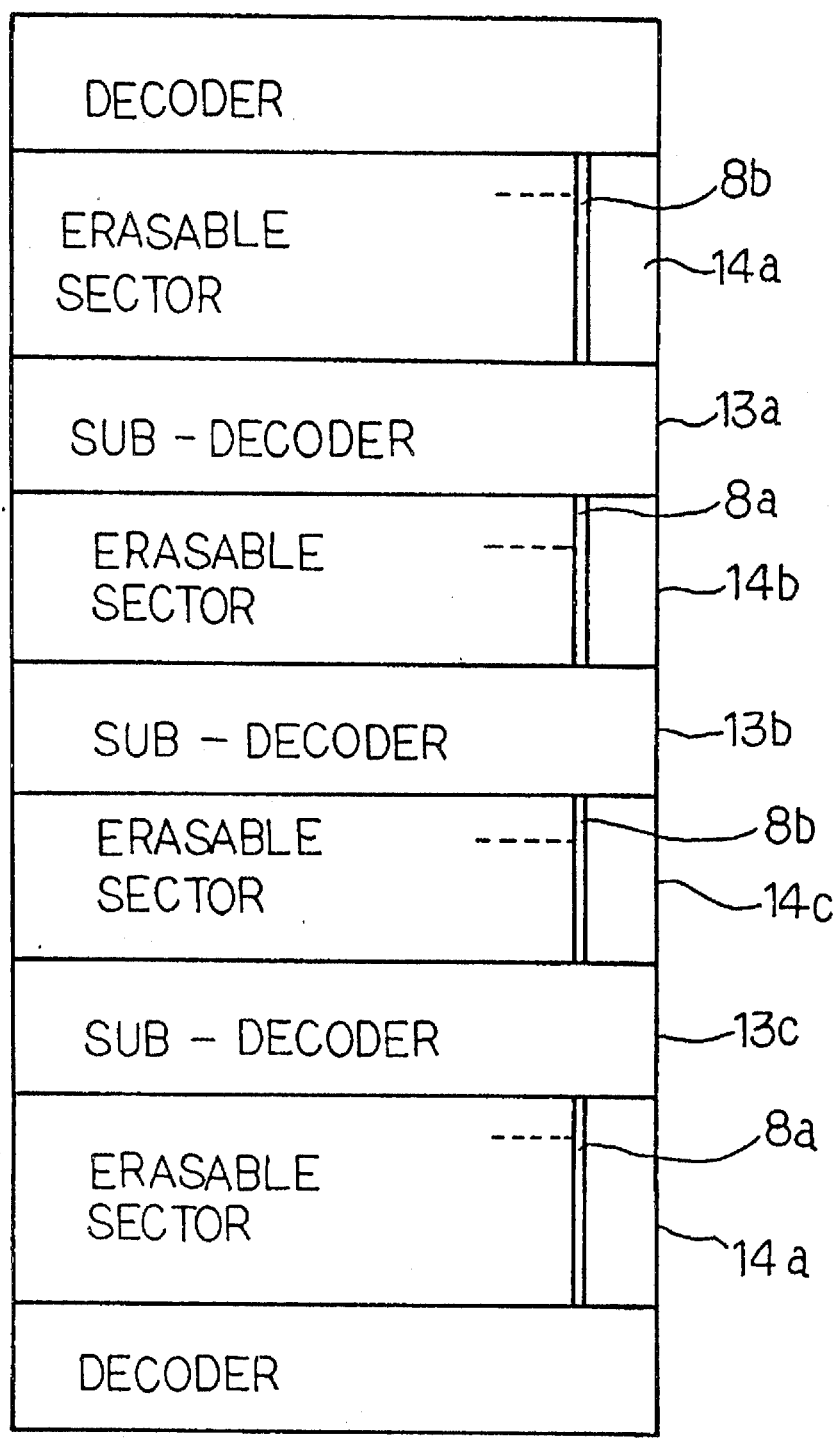
FIG. 3 is a schematic view showing the layout of a part of the prior art electrically erasable and programmable read only memory device.
Figure 4:
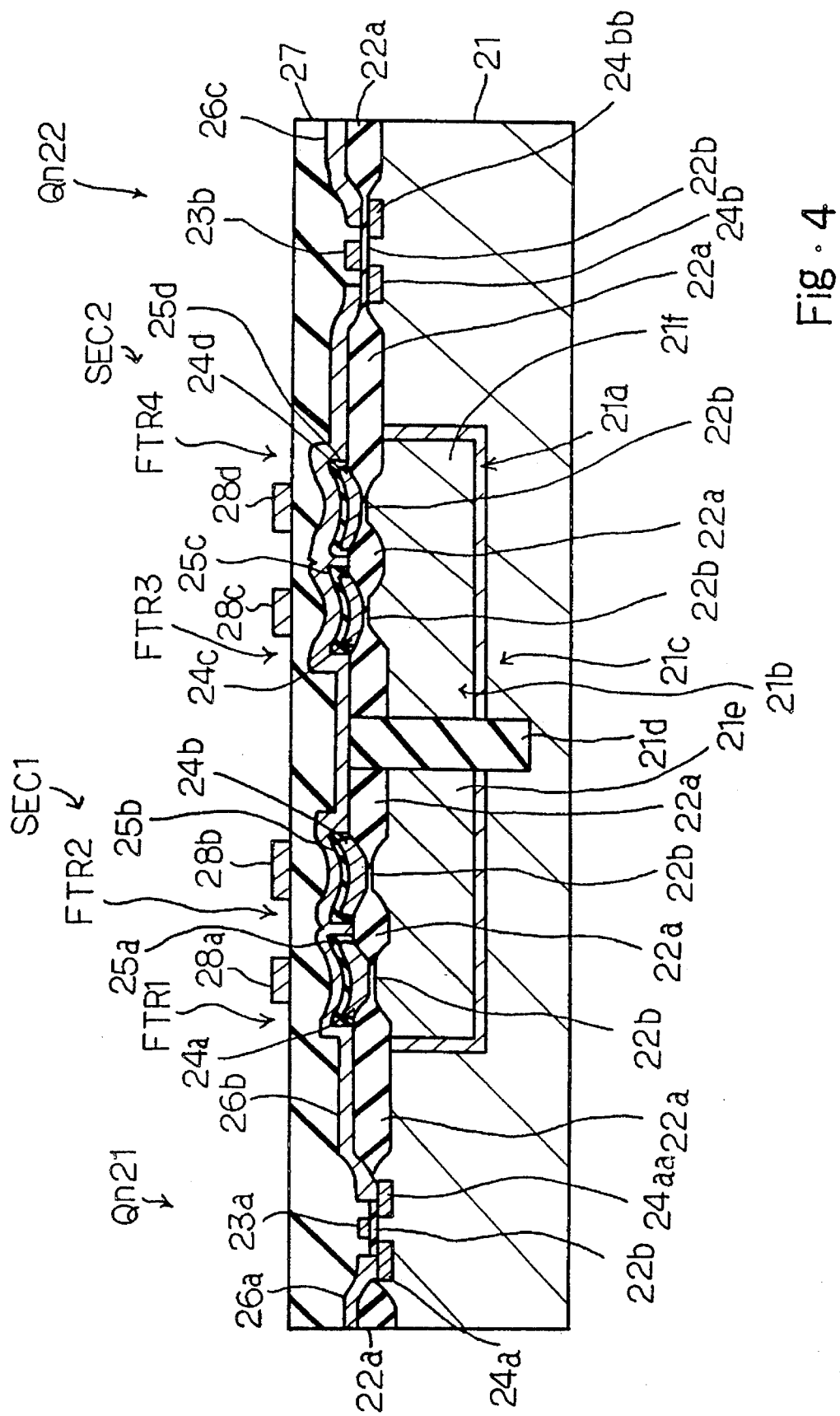
FIG. 4 is a cross sectional view showing the structure of an electrically erasable and programmable read only memory device according to the present invention on a cross section parallel to a word line.

Referring to FIG. 4 of the drawings, an electrically erasable and programmable read only memory device embodying the present invention is fabricated on a p-type silicon substrate 21, and an n-type well 21a is formed in the p-type silicon substrate 21. A p-type well 21b is nested in the n-type well 21a. The n-type well 21a and the p-type well 21b form a twin well 21c. An isolating wall 21d of silicon oxide projects through the twin well 21c into the p-type silicon substrate 21, and divides the twin well 21c into a plurality of sections 21e and 21f.

A field oxide layer 22a of 8000 angstroms thick is selectively grown on the major surface of the silicon substrate 21, and gate oxide films 22b of 100 angstroms thick cover exposed areas of the p-type silicon substrate 21 and exposed areas of the p-type wells 21b.

On the gate oxide films 22b are formed gate electrodes 23a and 23b which form n-channel enhancement type field effect transistors Qn21 and Qn22 together with the gate oxide films 22b and n-type source/drain regions 24aa and 24bb. On the other hand, floating gate electrodes 24a, 24b, 24c and 24d are formed on the gate oxide films 22b, and are electrically isolated by second gate oxide films 25a, 25b, 25c and 25d. In this instance, the second gate oxide films 25a to 25d are 200 angstroms in thickness.

Control gate electrodes 26a, 26b and 26c of doped polysilicon extend on the field oxide layer 22a and the second gate oxide films 25a to 25d, and an n-type source region and an n-type drain region are formed in the p-type well 21b on both sides of a channel region below each of the floating gate electrodes 24a, 24b, 24c and 24d. The n-type source regions and the n-type drain regions are not shown in FIG. 4 because the cross section passes through the channel regions. The gate oxide film 22b, the floating gate electrode 24a/24b/24c/24d, the second gate oxide film 25a/25b/25c/25d with the control gate electrode 26b, the n-type source region and the n-type drain region form floating gate type field effect transistor FTR1, FTR2, FTR3 and FTR4, and the control gate electrode 26b is shared between the floating gate type field effect transistors FTR1 to FTR4.

The cross section shown in FIG. 4 is repeated in the electrically erasable and programmable read only memory device at intervals. For this reason, the electrically erasable and programmable read only memory device has a plurality of floating gate type field effect transistors FTR1 and a plurality of floating gate type field effect transistors FTR2, and the floating gate type field effect transistors FTR1 and FTR2 form in combination a concurrently erasable memory sector SEC1 formed in the section 21e. Similarly, a plurality of floating gate type field effect transistors FTR3 and a plurality of floating gate type field effect transistors FTR4 form another electrically erasable memory sector formed in the section 21f. Thus, the electrically erasable and programmable read only memory device embodying the present invention has a large number of floating gate type field effect transistors respectively serving as memory cells, and the memory cells are organized in a plurality of electrically erasable memory sectors including the electrically erasable sectors SEC1, SEC2 as shown in FIG. 5.

The n-channel enhancement type field effect transistors Qn21 and Qn22 and the electrically erasable memory sectors SEC1 and SEC2 are covered with an inter-level insulating layer 27, and bit lines 28a, 28b, 28c and 28d extend on the inter-level insulating layer 27. The bit lines 28a to 28d pass through contact holes (not shown) formed in the inter-level insulating layer 27, and are held in contact with the n-type drain regions.

The floating gate type field effect transistors FTR1 to FTR4 respectively store data bits in the form of electric charges as similar to those of the prior art electrically erasable and programmable read only memory device.

Figure 5:
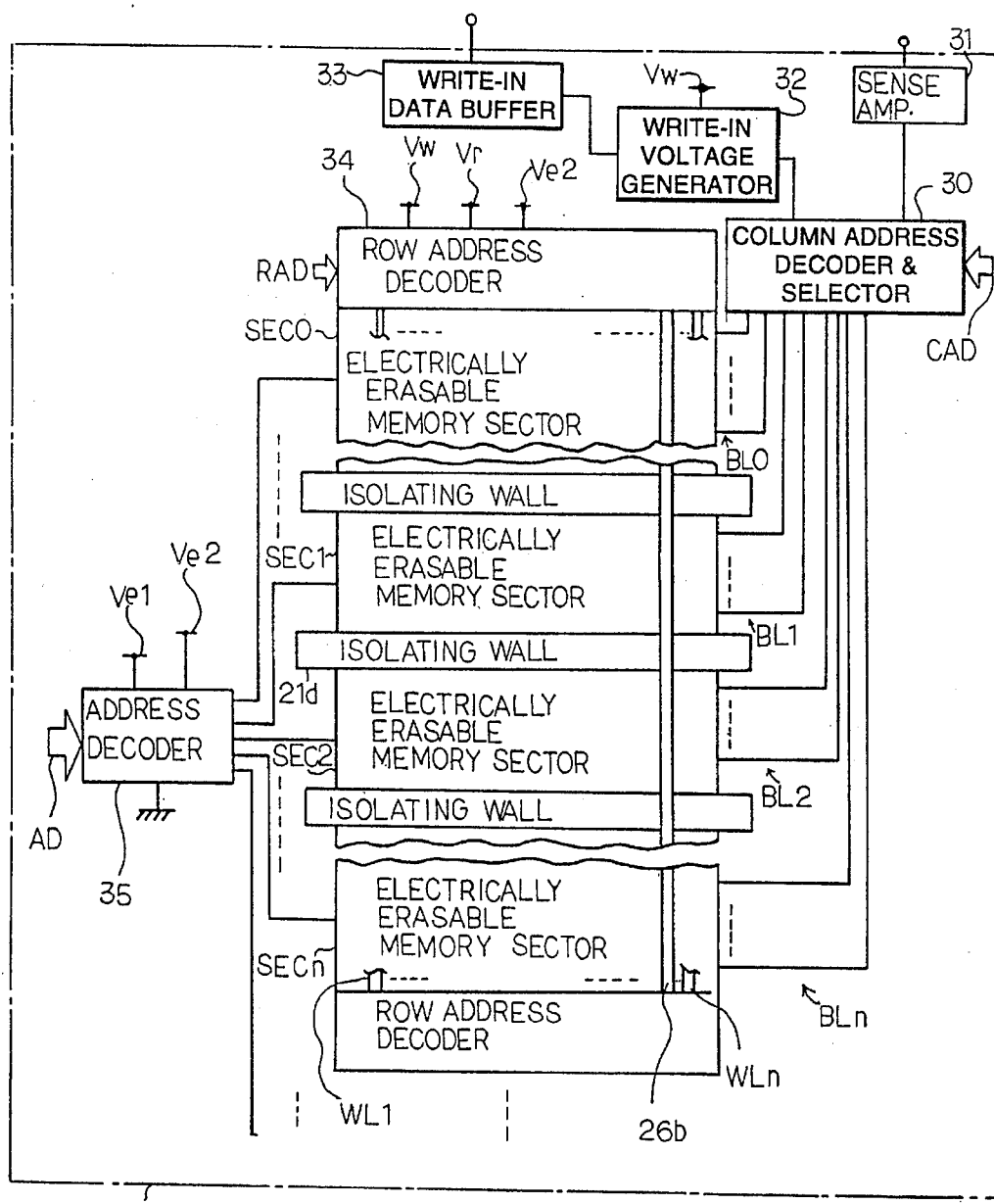
FIG. 5 is a block diagram showing the arrangement of a memory cell array incorporated in the electrically erasable and programmable read only memory device shown in FIG. 4.

As shown in FIG. 5, the electrically erasable memory selectors SEC0, SEC1, SEC2, . . . and SECn are respectively associated with a plurality of sets of bit lines BL0, BL1, BL2, . . . and BLn, and the bit lines 28a/28b and 28c/28d are incorporated in the sets BL1 and BL2, respectively. The memory sectors SEC0 to SECn form in combination a memory cell array, and the electrically erasable and programmable read only memory device has other memory cell arrays (not shown). The bit lines of each set are selectively connected to the n-type drain regions of the floating gate type field effect transistors of the associated memory sector. Though not shown in the drawings, the n-type source regions are connected to discharge lines.

A column address decoder and selector 30 is connected to the plurality of sets of bit lines BL0 to BLn, and is responsive to a column address signal CAD for selectively connecting the plurality of sets of bit lines BL0 to BLn to a current-mirror type sense amplifier circuit 31 in a read-out phase or a write-in voltage generator 32 associated with a write-in data buffer 33 in a read-out phase.

The plurality of memory sectors SEC0 to SECn are further associated with a plurality of word lines WL1 to WLm, and the control gate 26a forms a part of one of the plurality of word lines WL1 to WLm. The word lines WL1 to WLm are connected to a row address decoder 34, and the row address decoder 34 is responsive to a row address signal RAD for selectively energizing the word lines WL1 to WLm.

In this instance, the sets of bit lines BL1 to BLn, the column address decoder and selector 30, the sense amplifier 31, the write-in voltage generator 32, the write-in data buffer 33, the word lines WL1 to WLm and the row address decoder 34 as a whole constitute a write-in and read-out means. The column address signal CAD and the row address signal RAD are produced from an external column address signal and an external row address signal, respectively.

The sections such as 21e and 21f are respectively assigned to the plurality of memory sectors SEC0 to SECn, and are connected to an address decoder 35. The address decoder 35 is responsive to an address signal indicative of one of the memory sectors SEC0 to SECn in an erasing phase for erasing data bits stored in the floating gate type field effect transistors of the selected memory sector. Namely, the section assigned to the memory sector specified by the address signal is biased to 5 volts, and the other sections are biased to 14 volts for preventing the stored data bits from being erased. The positive bias voltage of 5 volts is applied to a part of the n-type well 21a and a part of the p-type well 21b of the selected section. In this instance, the address decoder 35 serves as a biasing circuit, and forms a part of an erasing means together with the row address decoder 34.

A fabrication process is briefly described hereinbelow. The twin well 21c is formed in the p-type silicon substrate 21, and the field oxide layer 22a is selectively grown on the major surface of the silicon substrate 21. A trench is vertically formed by using an anisotropic etching technique, and is deeper than the twin well 21c. Silicon oxide fills the trench for forming the isolating wall 21d, and the floating gate type field effect transistors FTR1 to FTR4 are formed in the sections 21e and 21f. The inter-level insulating layer 27 covers the floating gate type field effect transistors FTR1 to FTR4, and contact holes are formed in the inter-level insulating layer 27 for the bit lines. An aluminum alloy is deposited over the entire surface of the inter-level insulating layer 27, and is patterned into the bit lines 28a to 28d.

The electrically erasable and programmable read only memory device behaves as follows. When a data bit is written into one of the floating gate type field effect transistors FTR1 to FTR4, the n-type source region and the substrate 21 are grounded, and the write-in voltage generator 32 and the row address decoder 34 supply a positive high voltage level Vw through the column address decoder and selector 30 to the n-type drain region and directly to the control gate electrode 26b. Then, hot electrons are produced at the p-n junction between the n-type drain region and the p-type well 21b, and are attracted toward the floating gate electrode 24a/24b/24c/24d due to the electric field extending from the control gate electrode 26b. The hot electrons are accumulated in the floating gate electrode 24a/24b/24c/24d, and the floating gate type field effect transistor FTR1/FTR2/FTR3/FTR4 changes the threshold to the high level.

If one of the floating gate type field effect transistors FTR1 to FTR4 is accessed, the current-mirror type sense amplifier circuit 31 supplies current through the column address decoder and selector 30 to the associated bit line, and the row address decoder 34 supplies a read-out voltage between the high threshold level and the low threshold level to the associated control gate electrode 26b. If the selected floating gate type field effect transistor FTR1/.../FTR4 has the high threshold due to the accumulated electric charge, the floating gate type field effect transistor is turned off, and no current flows from the associated bit line to the discharge line. The current-mirror type sense amplifier circuit 31 detects the rise of voltage level on the selected bit line, and produces an output data signal indicative of the high threshold level. On the other hand, if the floating gate type field effect transistor has the low threshold, the read-out voltage Vr allows the floating gate type field effect transistor to turn on, and current to flow from the associated bit line to the discharge line. The current-mirror type sense amplifier circuit 31 detects the voltage decay due to the current, and produces the output data signal indicative of the low threshold level.

On the other hand, when the electrically erasable and programmable read only memory device enters into the erasing phase, data bits stored in the memory selectors SEC0 to SECn are selectively erased. If the address signal AD selects the memory sector SEC1 from the memory cell array, the section 21e is biased to a first erasing level Ve1 of 5 volts, and the control gate electrode 26b is biased to a second erasing level Ve2 of −14 volts. The other sections such as 21f are maintained at the same level as the control gate electrode Ve2. The n-type source and drain regions are opened. Then, the Fowler-Nordheim tunneling phenomenon takes place across the gate oxide films 22b of the floating gate type field effect transistors of the selected memory sector SEC1, and the accumulated electrons are evacuated from the floating gate electrode 24a and 24b. However, the Fowler-Nordheim tunneling phenomenon does not take place across the gate oxide films of the floating gate type field effect transistors fabricated on the other sections, and the data bits stored therein are maintained.

As will be appreciated from the foregoing description, the isolating wall 21d electrically separates the twin well 21c into the sections 21e, 21f, ..., and the erasing voltage is selectively applied to the sections for evacuating accumulated electric charges from the floating gate electrodes of the field effect transistors fabricated in the selected section. For this reason, no sub-decoder is inserted in each of the control electrode, and the electrically erasable and programmable read only memory device is fabricated on a small semiconductor chip.

Second Embodiment

Figure 6:
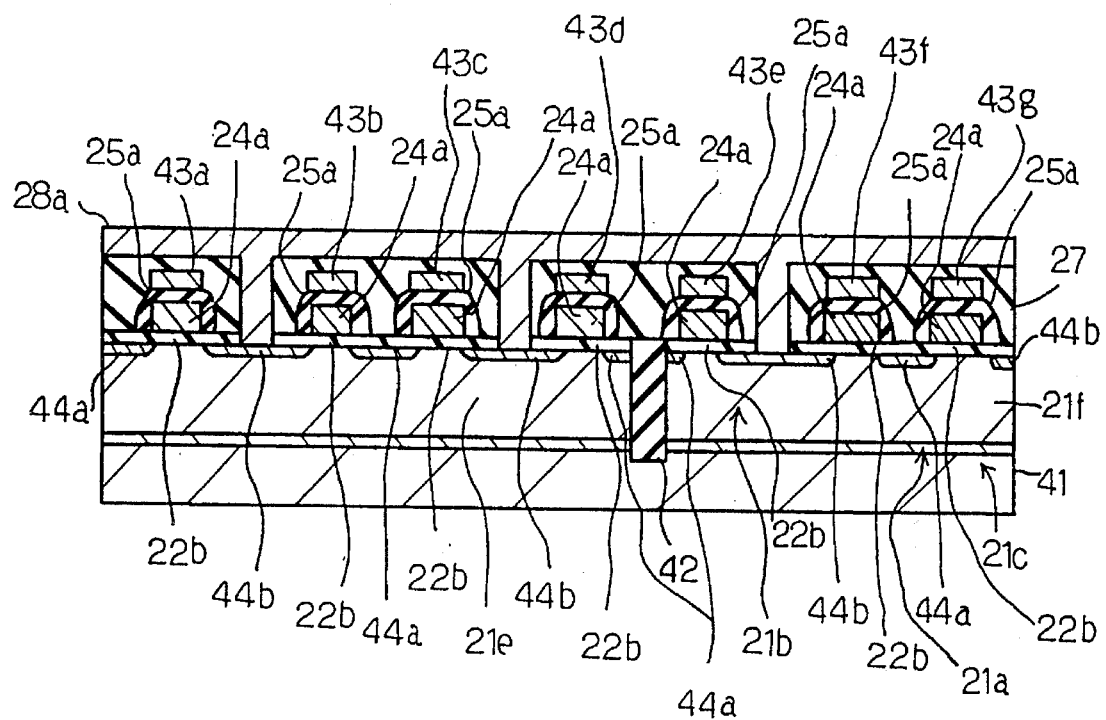
FIG. 6 is a cross sectional view showing the structure of the electrically erasable and programmable read only memory device on a cross section parallel to a bit line.

Turning to FIG. 6 of the drawings, another electrically erasable and programmable read only memory device is fabricated on a semiconductor chip 41. The electrically erasable and programmable read only memory device implementing the second embodiment is similar to the first embodiment except for an insulating wall 42 extending in parallel to word lines or control gate electrodes 43a, 43b, 43c, 43d, 43e, 43f and 43g. The other regions and layers of the second embodiment are similar to those of the first embodiment, and, for this reason, are labeled with the same references as those of the first embodiment without detailed description. References 44a and 44b designate the n-type source regions and the n-type drain regions, respectively.

The electrically erasable and programmable read only memory device behaves as similar to the first embodiment, and no further description is incorporated hereinbelow for avoiding repetition.

Although particular embodiments of the present invention have been shown and described, it will be obvious to those skilled in the art that various changes and modifications may be made without departing from the spirit and scope of the present invention. For example, the electrically erasable and programmable read only memory device according to the present invention may form a part of a large scale integration.

What is claimed is:

1. An electrically erasable and programmable read only memory device fabricated on a semiconductor substrate of a first conductivity type, comprising:

a first well of a second conductivity type opposite to said first conductivity type, and formed in a surface portion of said semiconductor substrate;

a second well of said first conductivity type nested into said first well;

a memory cell array implemented by a plurality of electrically erasable and programmable memory cells formed in said second well for storing data bits;

an isolating wall means extending from said surface portion of said semiconductor substrate through said first and second wells into a bottom portion of said semiconductor substrate, for electrically dividing said second well into a plurality of sections, and for forming said plurality of electrically erasable and programmable memory cells into a plurality of memory sectors in said sections;

a write-in and read-out means for selectively writing data bits into and reading out said data bits from said plurality of electrically erasable and programmable read only memory cells; and an erasing means having a biasing circuit that selectively biases said plurality of sections, for concurrently erasing the data bits stored in the electrically erasable and programmable read only memory cells of each memory sector using a Fowler-Nordheim tunneling current.

2. An electrically erasable and programmable read only memory device fabricated on a semiconductor substrate of a first conductivity type, comprising:

a first well formed in a surface portion of said semiconductor substrate and being a second conductivity type opposite to said first conductivity type;

a second well of said first conductivity type nested into said first well;

an isolating wall means for electrically separating said second well into a plurality of sections;

a memory cell array divided into a plurality of memory sectors respectively fabricated on said plurality of sections, each of said plurality of memory sectors being implemented by a plurality of floating gate type field effect transistors for storing data bits in the form of electrical charges, each floating gate type field effect transistor changing a threshold thereof depending upon the amount of electrical charges accumulated therein;

a plurality of word lines shared between said plurality of memory sectors, and operatively connected to select floating gate type field effect transistors from said memory cell array;

a plurality of bit lines selectively connected to the floating gate type field effect transistors of said memory cell array;

a write-in and read-out means for writing data bits into and reading out said data bits from said floating gate type field effect transistors of said memory cell array; and an erasing means for concurrently erasing said data bits stored in and of said plurality of memory sectors, and having a biasing means for selectively biasing one of said plurality of sections assigned to said each of said plurality of memory sectors, said erasing means further for evacuating the electrical charges from said plurality of floating gate type field effect transistors by injecting a Fowler-Nordheim tunneling current.

3. The electrically erasable and programmable read only memory device as set forth in claim 2, wherein said plurality of isolating walls extend in parallel to control gate electrodes of said floating gate type field effect transistors at spacings.

4. An electrically erasable and programmable read only memory device fabricated on a semiconductor region, comprising:

an isolating wall means for electrically separating said semiconductor region into a plurality of sections;

a memory cell array divided into a plurality of memory sectors respectively fabricated on said plurality of sections, each of said plurality of memory sectors being implemented by a plurality of floating gate type field effect transistors for storing data bits in the form of electrical charges, each floating gate type field effect transistor changing a threshold thereof depending upon the amount of electrical charges accumulated therein;

a plurality of word lines shared between said plurality of memory sectors, and operatively connected to select floating gate type field effect transistors from said memory cell array;

a plurality of bit lines selectively connected to the floating gate type field effect transistors of said memory cell array;

a write-in and read-out means for writing data bits into and reading out said data bits from said floating gate type field effect transistors of said memory cell array; and an erasing means for concurrently erasing said data bits stored in each of said plurality of memory sectors, and having a biasing means for selectively biasing one of said plurality of sections assigned to said each of said plurality of memory sectors, said erasing means further for evacuating the electrical charges from said plurality of floating gate type field effect transistors, wherein said semiconductor region and said isolating wall means are respectively implemented by a twin well formed in a semiconductor substrate and a plurality of isolating walls vertically penetrating through said twin well into said semiconductor substrate, and said plurality of isolating walls extend perpendicular to directions in which control gate electrodes of said floating gate type field effect transistors extend.

5. The electrically erasable and programmable read only memory device as set forth in claim 2, in which said biasing means applies a first erasing voltage level to said one of said plurality of sections for causing a tunneling phenomenon to take place across gate insulating films of said floating gate type field effect transistors, said biasing means further applying a second erasing voltage level to the others of said plurality of sections for preventing the electric charges from evacuation.

* * * * *